(12) United States Patent
Shin et al.

(10) Patent No.: US 11,137,682 B2
(45) Date of Patent: Oct. 5, 2021

(54) PHOTOSENSITIVE RESIN COMPOSITION AND CURED FILM PREPARED THEREFROM

(71) Applicant: ROHM AND HAAS ELECTRONIC MATERIALS KOREA LTD., Cheonan (KR)

(72) Inventors: Kahee Shin, Hwaseong (KR); Jong Han Yang, Hwaseong (KR); Geun Huh, Hwaseong (KR)

(73) Assignee: Rohm and Haas Electronic Materials Korea Ltd.

( * ) Notice: Subject to any disclaimer, the term of this patent is extended or adjusted under 35 U.S.C. 154(b) by 146 days.

(21) Appl. No.: 16/160,024

(22) Filed: Oct. 15, 2018

(65) Prior Publication Data
US 2020/0117088 A1 Apr. 16, 2020

(30) Foreign Application Priority Data

Nov. 16, 2017 (KR) .......................... 1020170153144

(51) Int. Cl.
| | |
|---|---|
| *G03F 7/075* | (2006.01) |
| *G03F 7/023* | (2006.01) |
| *G03F 7/022* | (2006.01) |
| *G03F 7/033* | (2006.01) |
| *G03F 7/039* | (2006.01) |

(52) U.S. Cl.
CPC ............ *G03F 7/0226* (2013.01); *G03F 7/033* (2013.01); *G03F 7/039* (2013.01); *G03F 7/0757* (2013.01)

(58) Field of Classification Search
CPC .... G03F 7/0226; G03F 7/0233; G03F 7/0757; C07D 251/02; C07D 251/04; C07D 251/06
See application file for complete search history.

(56) References Cited

U.S. PATENT DOCUMENTS

| | | | | |
|---|---|---|---|---|
| 8,828,640 B2* | 9/2014 | Wu | .......................... | C08L 83/06 430/189 |
| 8,921,024 B2* | 12/2014 | Wu | ........................ | G03F 7/0226 430/165 |
| 8,936,891 B2* | 1/2015 | Wu | .......................... | G03F 7/038 430/165 |
| 2010/0022090 A1* | 1/2010 | Sakaguchi | ........... | C09D 125/02 438/703 |
| 2011/0008730 A1* | 1/2011 | Hanamura | ............ | G03F 7/0757 430/270.1 |
| 2011/0033801 A1* | 2/2011 | Zampini | .................. | G03F 7/091 430/271.1 |
| 2012/0292487 A1* | 11/2012 | Yukawa | ............... | C07D 405/06 250/208.1 |
| 2014/0211334 A1* | 7/2014 | Yoshibayashi | ........... | G02B 5/23 359/891 |

FOREIGN PATENT DOCUMENTS

KR 2016-0061055 A 5/2016

\* cited by examiner

*Primary Examiner* — John S Chu
(74) *Attorney, Agent, or Firm* — G. Creston Campbell

(57) ABSTRACT

The present invention relates to a photosensitive resin composition that is excellent in adhesiveness and sensitivity. Specifically, the photosensitive resin composition is capable of providing a cured film that is excellent in transparency, sensitivity, chemical resistance, and adhesiveness upon immersion in a stripper. Thus, the cured film can be effectively used in a liquid crystal display, an organic EL display, and the like.

9 Claims, 5 Drawing Sheets

PHOTOSENSITIVE RESIN COMPOSITION AND CURED FILM PREPARED THEREFROM

TECHNICAL FIELD

The present invention relates to a photosensitive resin composition that is excellent in adhesiveness and sensitivity. Specifically, a cured film prepared from the photosensitive resin composition is excellent in transparency, sensitivity, chemical resistance, and adhesiveness upon immersion in a stripper.

BACKGROUND ART

In general, a transparent planarization film is formed on a substrate of a thin film transistor (TFT) for the purpose of insulation to prevent a contact between a transparent electrode and a data line in a liquid crystal display, an organic EL display, or the like. Through a transparent pixel electrode positioned near the data line, the aperture ratio of a panel may be enhanced, which makes it possible to attain high luminance/resolution. In order to form such a transparent planarization film, several processing steps are employed to impart a specific pattern profile, and a positive-type photosensitive resin composition is widely employed in this process since fewer processing steps are required. In particular, a positive-type photosensitive resin composition containing a siloxane polymer is well known as a material having high heat resistance, high transparency, and a low dielectric constant.

However, a planarization film or a display element made from a conventional positive-type photosensitive resin composition containing a siloxane polymer may involve a problem that when it is immersed in, or brought into contact with, an etching solution containing an acid, a stripper composed of an alkali, or the like in a post-process, the planarization film may be partially dissolved in the solution, the surface of the planarization film may be swollen, or the planarization film that is in contact with a substrate or an electrode may be peeled off therefrom. Thus, a planarization film or a display element is required to have excellent chemical resistance and adhesion to metals.

As an alternative to the above, Korean Laid-Open Patent Publication No. 2016-0061055 discloses a photosensitive resin composition comprising a siloxane polymer, an epoxy compound, and a 1,2-quinonediazide-based compound. Although the photosensitive resin composition, which comprises an epoxy compound, is excellent in chemical resistance, it has a disadvantage in that its sensitivity is poor due to its low developability and that it does not produce an effect of improving the adhesiveness to metals.

PRIOR ART DOCUMENT

Patent Document (Patent Document 1) Korean Laid-open Patent Publication No. 2016-0061055

DISCLOSURE OF THE INVENTION

Technical Problem

Thus, the present inventors have completed the present invention by developing a photosensitive resin composition that is excellent not only in chemical resistance and sensitivity, but also in adhesiveness to metals upon immersion in a stripper.

Accordingly, the present invention aims to provide a photosensitive resin composition, which is excellent in chemical resistance to such chemical substances as solvents, acids, alkalis, and the like used in a post-process and is excellent in sensitivity and adhesiveness to metals upon immersion in a stripper.

Solution to the Problem

In order to accomplish the above object, the present invention provides a photosensitive resin composition, which comprises:
(A) a siloxane polymer;
(B) a 1,2-quinonediazide-based compound; and
(C) a compound represented by the following Formula 1:

[Formula 1]

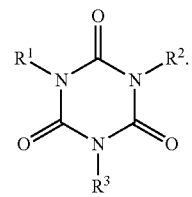

In the above Formula 1, $R^1$, $R^2$, and $R^3$ are each independently —$R^4$—Y—$R^5$, —$R^4$—Y—$R^6$-E, or —$R^4$-E, with the proviso that $R^1$, $R^2$, and $R^3$ are not simultaneously —$R^4$-E, $R^4$ is $C_{1-6}$ alkylene, hydroxy $C_{1-6}$ alkylene, or

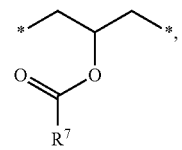

$R^5$ is $C_{1-6}$ alkyl, $C_{2-6}$ alkenyl,

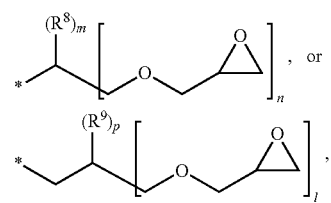

$R^6$ is $C_{1-6}$ alkylene,
$R^7$ is $C_{1-4}$ alkyl or $C_{2-4}$ alkenyl,
$R^8$ and $R^9$ are each independently hydrogen or $C_{1-3}$ alkyl,
m and n are each independently an integer of 0 to 3, with the proviso that m+n is 3,
l and p are each independently an integer of 0 to 3, with the proviso that l+p is 3,
E is an epoxy group, and
Y is a

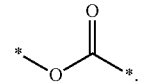

Advantageous Effects of the Invention

The photosensitive resin composition of the present invention comprises a hydrophilic additive to thereby facilitate the penetration of a developer and improve the sensitivity. In addition, the additive comprises an epoxy group, and the epoxy group of the additive binds to a silanol group in the siloxane polymer to improve the chemical resistance of the resin composition. Further, since the additive comprises an isocyanurate group and an ester group, it produces an effect of improving the chemical resistance, along with an effect of maintaining the adhesiveness to metals to be excellent even upon immersion in a stripper.

BEST MODE FOR CARRYING OUT THE INVENTION

Figure 1:
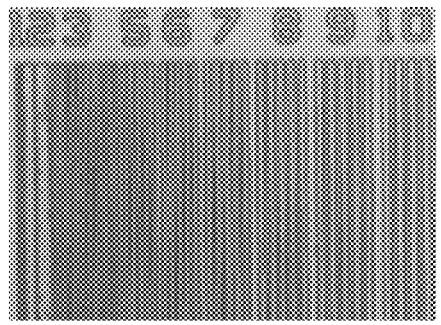
FIGS. 1 to 20 are the results of evaluation of the adhesion of the cured films prepared from the resin compositions of Examples 1 to 15 and Comparative Examples 1 to 5.

The photosensitive resin composition according to the present invention comprises:

(A) a siloxane polymer;

(B) a 1,2-quinonediazide-based compound; and (C) a compound represented by the following Formula 1:

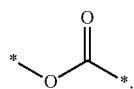
[Formula 1]

In the above Formula 1, $R^1$, $R^2$, and $R^3$ are each independently —$R^4$—Y—$R^5$, —$R^4$—Y—$R^6$-E, or —$R^4$-E, with the proviso that $R^1$, $R^2$, and $R^3$ are not simultaneously —$R^4$-E, $R^4$ is $C_{1-6}$ alkylene, hydroxy $C_{1-6}$ alkylene, or

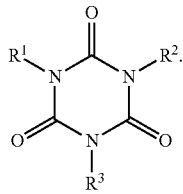

$R^5$ is $C_{1-6}$ alkyl, $C_{2-6}$ alkenyl,

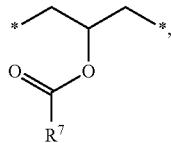, or

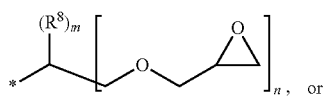, $R^6$ is $C_{1-6}$ alkylene, $R^7$ is $C_{1-4}$ alkyl or $C_{2-4}$ alkenyl, $R^8$ and $R^9$ are each independently hydrogen or $C_{1-3}$ alkyl, m and n are each independently an integer of 0 to 3, with the proviso that m+n is 3, l and p are each independently an integer of 0 to 3, with the proviso that l+p is 3, E is an epoxy group, and Y is

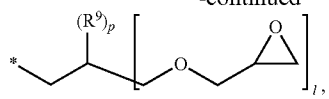

Hereinafter, the photosensitive resin composition will be described in detail with respect to each constituent component.

As used herein, "(meth)acryl" refers to "acryl" and/or "methacryl," and "(meth)acrylate" refers to "acrylate" and/or "methacrylate."

(A) Siloxane Polymer

In the photosensitive resin composition, which comprises the siloxane polymer (or polysiloxane), a positive pattern can be formed by a process that comprises the steps of from exposure to development.

The siloxane polymer may include a silane compound and/or a condensate of a hydrolysate thereof. In such event, the silane compound or the hydrolysate thereof may be a monofunctional to tetrafunctional silane compound. As a result, the siloxane polymer may comprise a siloxane structural unit selected from the following Q, T, D, and M types:

Q type siloxane structural unit: a siloxane structural unit comprising a silicon atom and adjacent four oxygen atoms, which may be derived from, e.g., a tetrafunctional silane compound or a hydrolysate of a silane compound that has four hydrolyzable groups.

T type siloxane structural unit: a siloxane structural unit comprising a silicon atom and adjacent three oxygen atoms, which may be derived from, e.g., a trifunctional silane compound or a hydrolysate of a silane compound that has three hydrolyzable groups.

D type siloxane structural unit: a siloxane structural unit comprising a silicon atom and adjacent two oxygen atoms (i.e., a linear siloxane structural unit), which may be derived from, e.g., a difunctional silane compound or a hydrolysate of a silane compound that has two hydrolyzable groups.

M type siloxane structural unit: a siloxane structural unit comprising a silicon atom and one adjacent oxygen atom, which may be derived from, e.g., a monofunctional silane compound or a hydrolysate of a silane compound that has one hydrolyzable group.

Specifically, the siloxane polymer (A) may comprise a structural unit derived from a compound represented by the following Formula 2.

$$(R^{10})_q Si(OR^{11})_{4-q}$$ [Formula 2]

In the above Formula 2, q is an integer of 0 to 3, $R^{10}$ is each independently $C_{1-12}$ alkyl, $C_{2-10}$ alkenyl, $C_{6-15}$ aryl, 3- to 12-membered heteroalkyl, 4- to 10-membered heteroalkenyl, or 6- to 15-membered heteroaryl, and $R^{11}$ is each independently hydrogen, $C_{1-5}$ alkyl, $C_{2-6}$ acyl, or $C_{6-15}$ aryl, wherein the heteroalkyl, the heteroalkenyl, and the heteroaryl each independently have at least one heteroatom selected from the group consisting of O, N, and S.

The compound of the above Formula 2 may be a tetrafunctional silane compound where q is 0, a trifunctional silane compound where q is 1, a difunctional silane compound where q is 2, or a monofunctional silane compound where q is 3.

Particular examples of the silane compound may include, e.g., as the tetrafunctional silane compound, tetraacetoxysilane, tetramethoxysilane, tetraethoxysilane, tetrabutoxysilane, tetraphenoxysilane, tetrabenzyloxysilane, and tetrapropoxysilane; as the trifunctional silane compound, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, pentafluorophenyltrimethoxysilane, phenyltrimethoxysilane, phenyltriethoxysilane, $d^3$-methyltrimethoxysilane, nonafluorobutylethyltrimethoxysilane, trifluoromethyltrimethoxysilane, n-propyltrimethoxysilane, n-propyltriethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, and 3-trimethoxysilylpropylsuccinic acid; as the difunctional silane compound, dimethyldiacetoxysilane, dimethyldimethoxysilane, diphenyldimethoxysilane, diphenyldiethoxysilane, diphenyldiphenoxysilane, dibutyldimethoxysilane, dimethyldiethoxysilane, (3-glycidoxypropyl)methyldimethoxysilane, (3-glycidoxypropyl)methyldiethoxysilane, 3-(2-aminoethylamino)propyldimethoxymethylsilane, 3-aminopropyldiethoxymethylsilane, 3-chloropropyldimethoxymethylsilane, 3-mercaptopropyldimethoxymethylsilane, cyclohexyldimethoxymethylsilane, diethoxymethylvinylsilane, dimethoxymethylvinylsilane, and dimethoxydi-p-tolylsilane; and as the monofunctional silane compound, trimethylmethoxysilane, tributylmethoxysilane, trimethylethoxysilane, tributylethoxysilane, (3-glycidoxypropyl)dimethylmethoxysilane, and (3-glycidoxypropyl)dimethylethoxysilane.

Preferred among the tetrafunctional silane compounds are tetramethoxysilane, tetraethoxysilane, and tetrabutoxysilane; preferred among the trifunctional silane compounds are methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, butyltrimethoxysilane, 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane; preferred among the difunctional silane compounds are dimethyldimethoxysilane, diphenyldimethoxysilane, diphenyldiethoxysilane, diphenyldiphenoxysilane, dibutyldimethoxysilane, and dimethyldiethoxysilane.

The conditions for preparing the hydrolysate of the silane compound represented by the above Formula 2 or the condensate thereof are not specifically limited.

The weight average molecular weight of the condensate (or siloxane polymer) obtained by the hydrolytic polymerization of the silane compound of the above Formula 2 may be in the range of 500 to 50,000 Da, 1,000 to 50,000 Da, 3,000 to 30,000 Da, or 5,000 to 20,000 Da. If the weight average molecular weight of the siloxane polymer is within the above range, it is more preferable in terms of the film formation properties, solubility, dissolution rates in a developer, and the like. The weight average molecular weight is measured by gel permeation chromatography (GPC, eluent: tetrahydrofuran) using a polystyrene standard.

The siloxane polymer may comprise a structural unit derived from a compound represented by the above Formula 2 where q is 0 (i.e., Q-type structural unit). Specifically, the siloxane polymer may comprise a structural unit derived from a compound represented by the above Formula 2 where q is 0 in an amount of 10 to 50% by mole or 15 to 40% by mole based on an Si atomic mole number. If the amount of the Q-type structural unit is within the above range, the photosensitive resin composition may maintain its solubility in an aqueous alkaline solution at a proper level during the formation of a pattern. Thus, it is possible to prevent any defects, which may be caused by a reduction in the solubility, or a drastic increase in the solubility of the composition.

The siloxane polymer may comprise a structural unit derived from a compound represented by the above Formula 2 where q is 1 (i.e., T-type structural unit). For example, the siloxane polymer comprises a structural unit derived from a compound represented by the above Formula 2 where q is 1 in an amount ratio of 40 to 99% by mole or 50 to 95% by mole based on an Si atomic mole number. If the amount of the T-type structural unit is within the above range, it is more preferable to form a more precise pattern profile.

In addition, it is more preferable that the siloxane polymer comprises a structural unit derived from a silane compound having an aryl group in terms of the hardness, sensitivity, and retention rate of a cured film. For example, the siloxane polymer may comprise a structural unit derived from a silane compound having an aryl group in an amount of 20 to 80% by mole, 30 to 70% by mole, or 30 to 50% by mole, based on an Si atomic mole number. If the amount of the structural unit derived from a silane compound having an aryl group is within the above range, it is more preferable in terms of the transparency of a cured film by virtue of the excellent compatibility of the siloxane polymer (A) and the 1,2-naphthoquinonediazide-based compound (B). It is also possible to prevent an excessive decrease in sensitivity.

The structural unit derived from a silane compound having an aryl group may be a structural unit derived from a silane compound of Formula 2 where $R^{10}$ is an aryl group, specifically a silane compound of Formula 2 where q is 1 and $R^{10}$ is an aryl group, more specifically a silane compound of Formula 2 where q is 1 and $R^{10}$ is a phenyl group (i.e., siloxane structural unit of T-phenyl type).

The term "% by mole based on an Si atomic mole number" as used herein refers to a percentage of the number of moles of Si atoms contained in a specific structural unit with respect to the total number of moles of Si atoms contained in all of the structural units constituting the siloxane polymer.

The molar amount of a siloxane unit in the siloxane polymer may be measured by the combination of Si-NMR, $^1$H-NMR, $^{13}$C-NMR, IR, TOF-MS, elementary analysis, measurement of ash, and the like. For example, in order to measure the molar amount of a siloxane unit having a phenyl group, an Si-NMR analysis is performed on the entire siloxane polymer. Then, an analysis of a phenyl-bound Si peak area and a phenyl-unbound Si peak area is performed. The molar amount is obtained from the ratio of the peak areas.

Meanwhile, the present invention may use a mixture of two or more siloxane polymers that have different dissolution rates in an aqueous solution of tetramethylammonium hydroxide (TMAH) as the siloxane polymer. If a mixture of two or more siloxane polymers as described above is used as the siloxane polymer, it is possible to improve both of the sensitivity and the chemical resistance of the resin composition.

Specifically, the siloxane polymer (A) is a mixture of two or more siloxane polymers that have different dissolution rates in an aqueous solution of tetramethylammonium hydroxide (TMAH). The siloxane polymer mixture may comprise (A-1) a first siloxane polymer that, when pre-baked, has a dissolution rate of 400 to 2,000 Å/sec in an aqueous solution of 2.38% by weight of tetramethylammonium hydroxide; and (A-2) a second siloxane polymer that, when pre-baked, has a dissolution rate of 1,900 to 8,000 Å/sec in an aqueous solution of 1.5% by weight of tetramethylammonium hydroxide.

The dissolution rate of a single siloxane polymer and a mixture thereof in an aqueous solution of TMAH may be measured as follows: a siloxane polymer sample is added to propylene glycol monomethyl ether acetate (PGMEA, solvent) such that the solids content is 17% by weight and dissolved with stirring at room temperature for 1 hour to prepare a siloxane polymer solution. Thereafter, 3 cc of the siloxane polymer solution thus prepared is dropped onto a central area of a silicon wafer having a diameter of 6 inches and a thickness of 525 μm using a pipette in a clean room in an atmosphere of a temperature of 23.0±0.5° C. and a humidity of 50±5.0%, which is spin-coated such that the thickness is 2±0.1 μm. Thereafter, the wafer is heated on a hot plate at 105° C. for 90 seconds to remove the solvent, and the thickness of the coated film is measured with a spectroscopic ellipsometer (Woollam). Then, the dissolution rate is calculated by measuring the thickness of the cured film on the silicon wafer with a thin film analyzer (TFA-11CT, Shinyoung Corporation) using an aqueous solution of 2.38% by weight of TMAH or an aqueous solution of 1.5% by weight of TMAH with respect to the dissolution time.

The photosensitive resin composition of the present invention may comprise the siloxane polymer in an amount of 50 to 95% by weight or 60 to 90% by weight based on the total weight of the solids content of the composition, exclusive of solvents. If the content of the siloxane polymer is within the above range, it is possible to maintain the developability of the composition at a suitable level, thereby producing a cured film that is excellent in the film retention rate and the pattern resolution.

The siloxane polymer may comprise 60 to 100% by weight, 60 to 99% by weight, or 80 to 99% by weight of the first siloxane polymer (A-1) based on the total weight of the siloxane polymer. If the content of the first siloxane polymer is within the above range, it is possible to maintain the developability of the composition at a suitable level, thereby producing a cured film that is excellent in the film retention rate and the pattern resolution.

The siloxane polymer may comprise 0 to 40% by weight, 1 to 40% by weight, or 1 to 20% by weight of the second siloxane polymer (A-2) based on the total weight of the siloxane polymer. If the content of the second siloxane polymer is within the above range, it is possible to maintain the developability of the composition at a suitable level, thereby producing a cured film that is excellent in the film retention rate and the pattern resolution.

(B) 1,2-Quinonediazide-Based Compound

The 1,2-quinonediazide-based compound is not particularly limited as long as it is used as a photosensitive agent in the photoresist field and has a 1,2-quinonediazide-based structure.

Examples of the 1,2-quinonediazide-based compound include an ester compound of a phenolic compound and 1,2-benzoquinonediazide-4-sulfonic acid or 1,2-benzoquinonediazide-5-sulfonic acid; an ester compound of a phenolic compound and 1,2-naphthoquinonediazide-4-sulfonic acid or 1,2-naphthoquinonediazide-5-sulfonic acid; a sulfonamide compound of a phenolic compound in which the hydroxyl group is substituted with an amino group and 1,2-benzoquinonediazide-4-sulfonic acid or 1,2-benzoquinonediazide-5-sulfonic acid; a sulfonamide compound of a phenolic compound in which the hydroxyl group is substituted with an amino group and 1,2-naphthoquinonediazide-4-sulfonic acid or 1,2-naphthoquinonediazide-5-sulfonic acid. The above compounds may be used alone or in combination of two or more thereof.

Examples of the phenolic compound include 2,3,4-trihydroxybenzophenone, 2,4,6-trihydroxybenzophenone, 2,2',4,4'-tetrahydroxybenzophenone, 2,3,3',4-tetrahydroxybenzophenone, 2,3,4,4'-tetrahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenylmethane, 3,3,3',3'-tetramethyl-1,1'-spirobiindene-5,6,7,5',6',7'-hexanol, 2,2,4-trimethyl-7,2',4'-trihydroxyflavane, bis[4-hydroxy-3-(2-hydroxy-5-methylbenzyl)-5-dimethylphenyl]methane, and the like.

More particular examples of the 1,2-quinonediazide-based compound include an ester compound of 2,3,4-trihydroxybenzophenone and 1,2-naphthoquinonediazide-4-sulfonic acid, an ester compound of 2,3,4-trihydroxybenzophenone and 1,2-naphthoquinonediazide-5-sulfonic acid, an ester compound of 4,4'-[1-[4-[1-[4-hydroxyphenyl]-1-methylethyl]phenyl]ethylidene]bisphenol and 1,2-naphthoquinonediazide-4-sulfonic acid, an ester compound of 4,4'-[1-[4-[1-[4-hydroxyphenyl]-1-methylethyl]phenyl]ethylidene]bisphenol and 1,2-naphthoquinonediazide-5-sulfonic acid, an ester compound of bis[4-hydroxy-3-(2-hydroxy-5-methylbenzyl)-5-dimethylphenyl]methane and 1,2-naphthoquinonediazide-5-sulfonic acid, and the like. If the compounds exemplified above are used as the 1,2-quinonediazide-based compound, the transparency of the photosensitive resin composition may be further enhanced.

The 1,2-quinonediazide-based compound (B) may be employed in an amount ranging from 2 to 50 parts by weight or 5 to 20 parts by weight based on 100 parts by weight of the siloxane polymer (A) on the basis of the solids content, exclusive of solvents. If the content of the 1,2-quinonediazide-based compound is within the above range, a pattern is more readily formed from the resin composition, while it is possible to suppress such defects as a rough surface of a coated film upon the formation thereof and scum at the bottom portion of the pattern upon development.

(C) Compound Represented by Formula 1

Since the photosensitive resin composition of the present invention comprises a compound represented by the above Formula 1, it facilitates the penetration of a developer, resulting in excellent sensitivity. It also gives rise to excellent chemical resistance and adhesiveness to a metal substrate.

Specifically, the epoxy group of the compound represented by the above Formula 1 binds to a silanol group in the siloxane polymer to improve the chemical resistance of the resin composition. Further, the compound comprises an isocyanurate group and an ester group, whereby the nitrogen atom of the isocyanurate group and the oxygen atom of the ester group form a bridge type bond with the metal atom of a substrate or an electrode. Thus, it is possible to enhance the adhesiveness of a cured film formed from the photosensitive resin composition to the metal substrate or the electrode. Accordingly, the photosensitive resin composition produces an effect of improving the chemical resistance attributable to the epoxy group, along with an effect of maintaining the adhesiveness between a cured film formed from the photosensitive resin composition and a metal substrate or an electrode even upon immersion in a stripper in a post-process.

Specifically, in the compound represented by the above Formula 1, $R^4$ may be methylene, ethylene ($-C_2H_4-$),

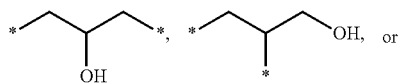

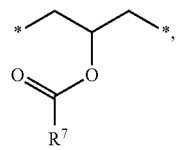

$R^5$ may be methyl, ethyl, propyl, ethenyl ($-C_2H_3$), propenyl ($-C_3H_5$),

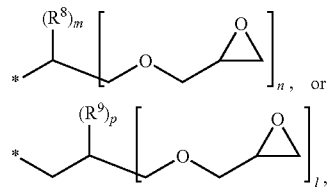

$R^6$ may be $C_{1-3}$ alkylene, and $R^7$ may be ethyl or propenyl ($-C_3H_5$).

More specifically, the compound (C) represented by the above Formula 1 may be any one of the compounds represented by the following Formulae 3 to 21. Even more specifically, the compound (C) represented by the above Formula 1 may be any one of the compounds represented by the following Formulae 3 to 14. Preferred among these are the compound of the following Formulae 9 and 12 in terms of the sensitivity and developability.

[Formula 3]

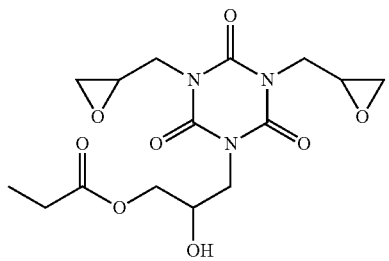

[Formula 4]

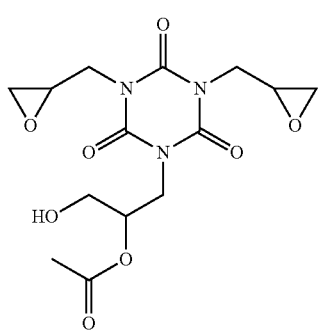

[Formula 5]
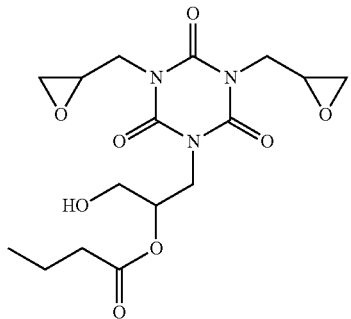
[Formula 6]
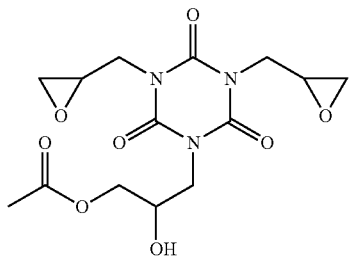
[Formula 7]
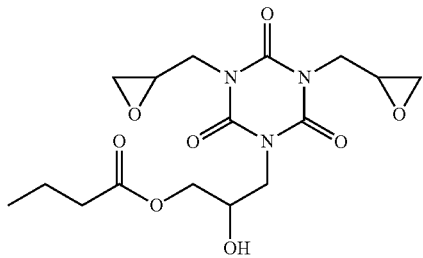
[Formula 8]
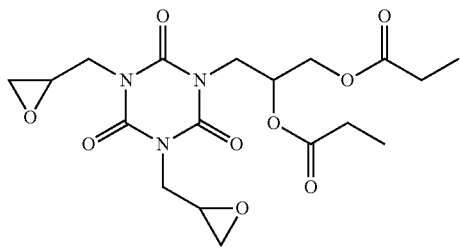
[Formula 9]
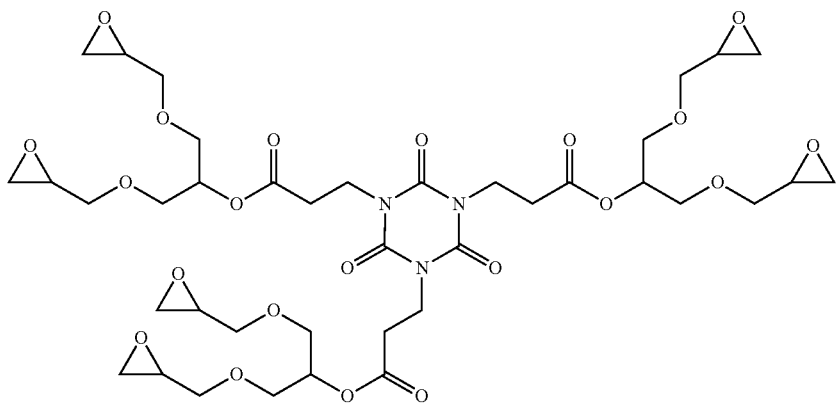

[Formula 10]
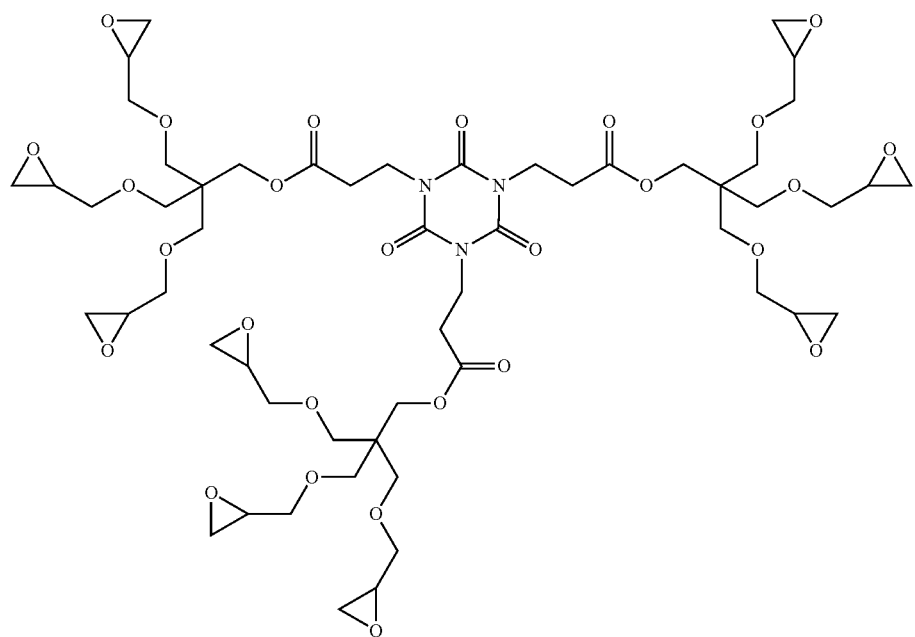
[Formula 11]
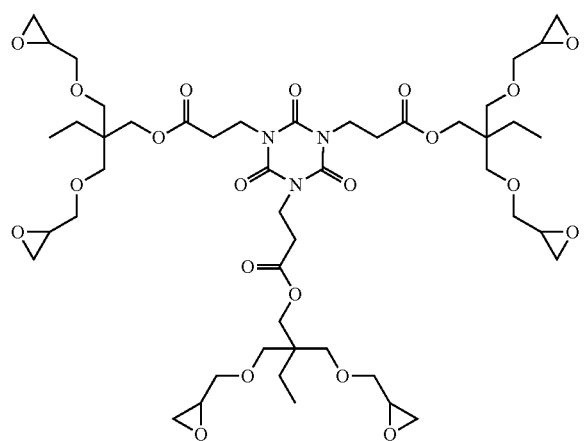
[Formula 12]
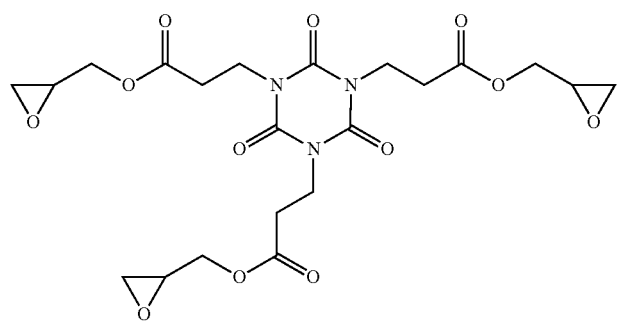

-continued
[Formula 13]
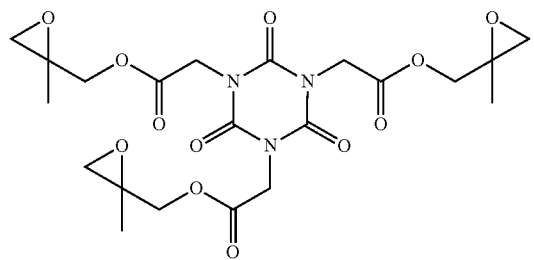
[Formula 14]
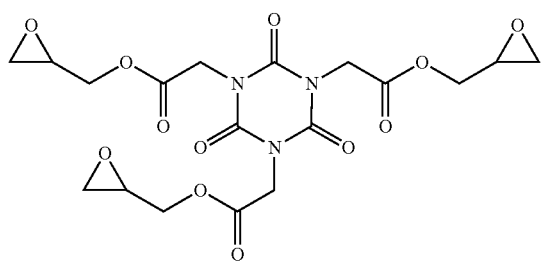
[Formula 15]
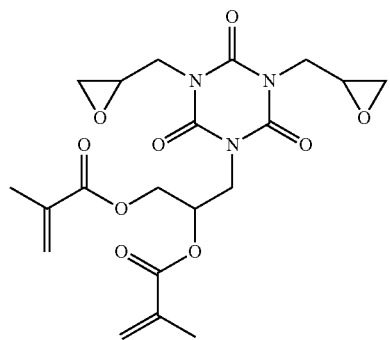
[Formula 16]
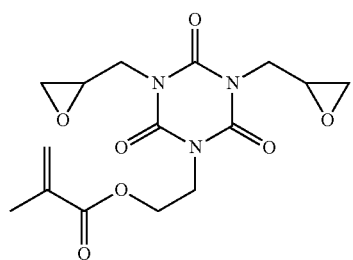
[Formula 17]
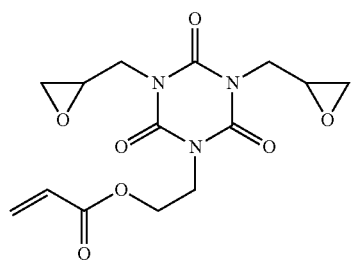

[Formula 18]

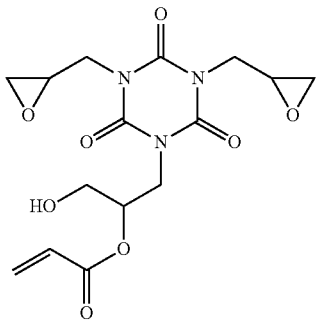

[Formula 19]

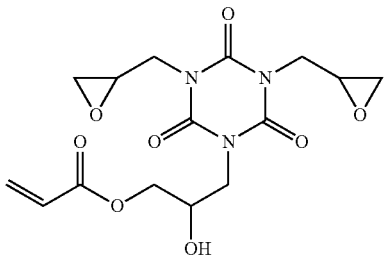

[Formula 20]

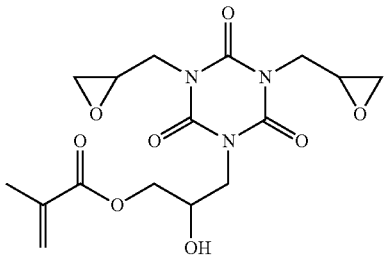

[Formula 21]

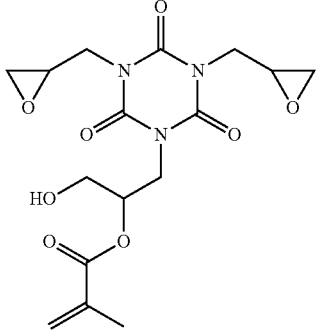

The compound (C) represented by the above Formula 1 may be employed in an amount ranging from 0.5 to 30 parts by weight, 1 to 20 parts by weight, or 1.6 to 16 parts by weight, based on 100 parts by weight of the siloxane polymer (A) on the basis of the solids content. If the content of the compound (C) represented by the above Formula 1 is within the above range, it is possible to suppress the problems that the sensitivity, chemical resistance, and adhesiveness upon immersion in a stripper are not improved and that the surface of a coated film upon the formation thereof is rough and scum is formed at the bottom portion of the pattern upon development.

The photosensitive resin composition may further comprise at least one selected to from the group consisting of (D) an epoxy compound, (E) a surfactant, and (F) a silane compound.

(D) Epoxy Compound

The epoxy compound may increase the internal density of the resin composition, to thereby improve the chemical resistance of a cured film formed therefrom.

The epoxy compound (D) may be a homo-oligomer or a hetero-oligomer of an unsaturated monomer containing at least one epoxy group.

Examples of the unsaturated monomer containing at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, and the like. Specifically, glycidyl methacrylate may be used.

The epoxy compound may be synthesized by any conventional methods well known in the art. An example of the commercially available epoxy compound may include GHP03 (glycidyl methacrylate homopolymer, Miwon Commercial Co., Ltd.).

The epoxy compound (D) may further comprise the following structural unit.

Particular examples of the additional structural unit may include any structural unit derived from styrene; a styrene having an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; a styrene having a halogen such as fluorostyrene, chlorostyrene, bromostyrene, and iodostyrene; a styrene having an alkoxy substituent such as methoxystyrene, ethoxystyrene, and propoxystyrene; p-hydroxy-α-methylstyrene, acetylstyrene; an ethylenically unsaturated compound having an aromatic ring such as divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, phenyl (meth)acrylate, benzyl (meth) acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1, 3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine having an N-vinyl group such as N-vinyl pyrrolidone, N-vinyl carbazole, and N-vinyl morpholine; an unsaturated ether such as vinyl methyl ether, vinyl ethyl ether, allyl glycidyl ether, and 2-methylallyl glycidyl ether; an unsaturated imide such as N-phenylmaleimide, N-(4-chlorophenyl)maleimide, N-(4-hydroxyphenyl)maleimide, and N-cyclohexylmaleimide. The structural unit derived from the compounds exemplified above may be contained in the epoxy compound (D) alone or in combination of two or to more thereof. Specifically, the styrene compounds are preferred among these examples from the viewpoint of polymerizability of the composition. In particular, it is more preferable in terms of the chemical resistance that the epoxy compound does not contain a carboxyl group by way of not using a structural unit derived from a monomer containing a carboxyl group among these compounds.

The weight average molecular weight of the epoxy compound may be in the range of 100 to 30,000 Da, 1,000 to 20,000 Da, 1,000 to 15,000 Da, or 6,000 to 10,000 Da. If the weight average molecular weight of the epoxy compound is 100 or more, a cured film may have more excellent hardness. Also, if the weight average molecular weight of the epoxy compound is 30,000 or less, a cured film may have a uniform thickness, which is suitable for planarizing any steps thereon. The weight average molecular weight is measured by gel permeation chromatography (GPC, eluent: tetrahydrofuran) using a polystyrene standard.

The epoxy compound (D) may be employed in an amount ranging from 1 to 40 parts by weight or 5 to 25 parts by weight based on 100 parts by weight of the siloxane polymer (A) on the basis of the solids content. If the content of the epoxy compound (D) is within the above range, the chemical resistance and sensitivity of the photosensitive resin composition may be more favorable.

(E) Surfactant

The photosensitive resin composition of the present invention may further comprise a surfactant to enhance its coatability, if desired.

The kind of the surfactant is not particularly limited, but examples thereof include fluorine-based surfactants, silicon-based surfactants, non-ionic surfactants, and the like.

Specific examples of the surfactants may include fluorine- and silicon-based surfactants such as FZ-2122 supplied by Dow Corning Toray Co., Ltd., BM-1000 and BM-1100 supplied by BM CHEMIE Co., Ltd., Megapack F-142 D, F-172, F-173, and F-183 supplied by Dai Nippon Ink Chemical Kogyo Co., Ltd., Florad FC-135, FC-170 C, FC-430, and FC-431 supplied by Sumitomo 3M Ltd., Sufron S-112, S-113, S-131, S-141, S-145, S-382, SC-101, SC-102, SC-103, SC-104, SC-105, and SC-106 supplied by Asahi Glass Co., Ltd., Eftop EF301, EF303, and EF352 supplied by Shinakida Kasei Co., Ltd., SH-28 PA, SH-190, SH-193, SZ-6032, SF-8428, DC-57, and DC-190 supplied by Toray Silicon Co., Ltd.; non-ionic surfactants such as polyoxyethylene alkyl ethers including polyoxyethylene lauryl ether, polyoxyethylene stearyl ether, polyoxyethylene oleyl ether, and the like, polyoxyethylene aryl ethers including polyoxyethylene octylphenyl ether, polyoxyethylene nonylphenyl ether, and the like, and polyoxyethylene dialkyl esters including polyoxyethylene dilaurate, polyoxyethylene distearate, and the like; and organosiloxane polymer KP341 (manufactured by Shin-Etsu Chemical Co., Ltd.), (meth) acrylate-based copolymer Polyflow No. 57 and 95 (Kyoei Yuji Chemical Co., Ltd.), and the like. They may be used alone or in combination of two or more thereof.

The surfactant (E) may be employed in an amount ranging from 0.001 to 5 parts by weight, 0.05 to 3 parts by weight, or 0.2 to 2 parts by weight, based on 100 parts by weight of the siloxane polymer (A) on the basis of the solids content. Within the above amount range, the coating and leveling characteristics of the composition may be good.

(F) Silane Compound

The photosensitive resin composition of the present invention may further comprise a silane compound, to thereby improve the chemical resistance in the treatment of a post-process by reducing the content of highly reactive silanol groups (Si—OH) in the siloxane polymer, in association with the epoxy compound.

The silane compound (F) may be a compound represented by the following Formula 22.

$$(R^{12})_o Si(OR^{13})_{4-o}$$ [Formula 22]

In the above Formula 22, o is an integer of 0 to 3, $R^{12}$ is each independently $C_{1-12}$ alkyl, $C_{2-10}$ alkenyl, $C_{6-15}$ aryl, 3- to 12-membered heteroalkyl, 4- to 10-membered heteroalkenyl, or 6- to 15-membered heteroaryl, R[13] is each independently hydrogen, $C_{1-5}$ alkyl, $C_{2-6}$ acyl, or $C_{6-15}$ aryl, wherein the heteroalkyl, the heteroalkenyl, and the heteroaryl each independently have at least one heteroatom selected from the group consisting of O, N, and S.

The silane compound of the above Formula 22 may be a tetrafunctional silane compound where o is 0, a trifunctional silane compound where o is 1, a difunctional silane compound where o is 2, or a monofunctional silane compound where o is 3.

Particular examples of the silane compound may include, e.g., as the tetrafunctional silane compound, tetraacetoxysilane, tetramethoxysilane, tetraethoxysilane, tetrabutoxysilane, tetraphenoxysilane, tetrabenzyloxysilane, and tetrapropoxysilane; as the trifunctional silane compound, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, pentafluorophenyltrimethoxysilane, phenyltrimethoxysilane, phenyltriethoxysilane, $d^3$-methyltrimethoxysilane, nonafluorobutylethyltrimethoxysilane, trifluoromethyltrimethoxysilane, n-propyltrimethoxysilane, n-propyltriethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, and 3-trimethoxysilylpropylsuccinic acid; as the difunctional silane compound, dimethyldiacetoxysilane, dimethyldimethoxysilane, diphenyldimethoxysilane, diphenyldiethoxysilane, diphenyldiphenoxysilane, dibutyldimethoxysilane, dimethyldiethoxysilane, (3-glycidoxypropyl)methyldimethoxysilane, (3-glycidoxypropyl)methyldiethoxysilane, 3-(2-aminoethylamino)propyldimethoxymethylsilane, 3-aminopropyldiethoxymethylsilane, 3-chloropropyldimethoxymethylsilane, 3-mercaptopropyldimethoxymethylsilane, cyclohexyldimethoxymethylsilane, diethoxymethylvinylsilane, dimethoxymethylvinylsilane, and dimethoxydi-p-tolylsilane; and as the monofunctional silane compound, trimethylmethoxysilane, tributylethoxysilane, trimethylethoxysilane, tributylethoxysilane, (3-glycidoxypropyl)dimethylmethoxysilane, and (3-glycidoxypropyl)dimethylethoxysilane.

Preferred among the tetrafunctional silane compounds are tetramethoxysilane, tetraethoxysilane, and tetrabutoxysilane; preferred among the trifunctional silane compounds are methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, butyltrimethoxysilane, 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane; preferred among the difunctional silane compounds are dimethyldimethoxysilane, diphenyldimethoxysilane, diphenyldiethoxysilane, diphenyldiphenoxysilane, dibutyldimethoxysilane, and dimethyldiethoxysilane. These silane compounds may be used alone or in combination of two or more thereof.

Specifically, the silane compound (F) may be a tetrafunctional silane compound (Q type silane compound) where o is 0 in the above Formula 22 or a trifunctional silane compound (T type silane compound) where o is 1 in the above Formula 22.

The silane compound (F) may be employed in an amount ranging from 0 to 20 parts by weight, 1 to 15 parts by weight, or 4 to 12 parts by weight, based on 100 parts by weight of the siloxane polymer (A) on the basis of the solids content. If the content of the silane compound is within the above range, the chemical resistance of a cured film to be formed may be further enhanced.

(G) Solvent

The photosensitive resin composition of the present invention may be prepared as a liquid composition in which the above components are mixed with a solvent. The solvent may be, for example, an organic solvent.

The content of the solvent in the photosensitive resin composition according to the present invention is not particularly limited. For example, the solvent may be employed such that the solids content is 10 to 70% by weight or 15 to 60% by weight based on the total weight of the photosensitive resin composition. The solids content refers to the components constituting the resin composition of the present invention, exclusive of solvents. If the content of the solvent is within the above range, a coating can be readily formed, and the flowability can be maintained at a proper level.

The solvent is not particularly limited as long as it can dissolve the above-mentioned components and is chemically stable. For example, the solvent may be an alcohol, an ether, a glycol ether, an ethylene glycol alkyl ether acetate, diethylene glycol, a propylene glycol monoalkyl ether, a propylene glycol alkyl ether acetate, a propylene glycol alkyl ether propionate, an aromatic hydrocarbon, a ketone, an ester, and the like.

Specifically, examples of the solvent include methanol, ethanol, tetrahydrofuran, dioxane, methyl cellosolve acetate, ethyl cellosolve acetate, ethyl acetoacetate, ethylene glycol monomethyl ether, ethylene glycol monoethyl ether, ethylene glycol dimethyl ether, ethylene glycol diethyl ether, propylene glycol dimethyl ether, propylene glycol diethyl ether, diethylene glycol monomethyl ether, diethylene glycol monoethyl ether, diethylene glycol dimethyl ether, diethylene glycol ethyl methyl ether, propylene glycol monomethyl ether, propylene glycol monoethyl ether, propylene glycol monopropyl ether, dipropylene glycol dimethyl ether, dipropylene glycol diethyl ether, propylene glycol methyl ether acetate, propylene glycol ethyl ether acetate, propylene glycol propyl ether acetate, dipropylene glycol methyl ether acetate, propylene glycol butyl ether acetate, toluene, xylene, methyl ethyl ketone, 4-hydroxy-4-methyl-2-pentanone, cyclopentanone, cyclohexanone, 2-heptanone, γ-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 2-methoxypropionate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methylpyrrolidone, and the like.

Preferred among the above are ethylene glycol alkyl ether acetates, diethylene glycols, propylene glycol monoalkyl ethers, propylene glycol alkyl ether acetates, ketones and the like. In particular, preferred are diethylene glycol dimethyl ether, diethylene glycol ethyl methyl ether, dipropylene glycol dimethyl ether, dipropylene glycol diethyl ether, propylene glycol monomethyl ether, propylene glycol monoethyl ether, propylene glycol methyl ether acetate, methyl 2-methoxypropionate, γ-butyrolactone, 4-hydroxy-4-methyl-2-pentanone, and the like. The solvents exemplified above may be used alone or in combination of two or more thereof.

In addition to the above, other additive components may be comprised in the photosensitive resin composition of the present invention within a range that does not adversely affect the physical properties of the composition.

The film retention rate of a cured film formed from the photosensitive resin composition as calculated from the following Equation 1 may be 50% or more, 55% or more, or 55 to 100%.

Film retention rate (%)=(film thickness after post-bake/film thickness after pre-bake)×100  [Equation 1]

The swollen thickness of a cured film formed from the photosensitive resin composition as calculated from the following Equation 2 may be 1,500 Å or less, 1,490 Å or less, or 1,480 Å or less.

Swollen thickness (Å)=film thickness ($T2$) after immersion in a chemical in a post-process−film thickness ($T1$) before immersion in a chemical in a post-process  [Equation 2]

The photosensitive resin composition according to the present invention may be used as a positive-type photosensitive resin composition. In particular, since the photosensitive resin composition of the present invention comprises a compound represented by the above Formula 1, it facilitates the penetration of a developer, resulting in excellent sensitivity and an enhancement in the chemical resistance and adhesiveness to a metal substrate. By virtue of the enhanced chemical resistance, the adhesiveness to metals can be maintained to be excellent even upon immersion in a stripper.

Cured Film

The present invention provides a cured film formed from the photosensitive resin composition.

The cured film may be formed by a method known in the art, for example, a method in which the photosensitive resin composition is coated on a substrate and then cured. In such event, the coating step may be carried out by a spin coating method, a slit coating method, a roll coating method, a screen printing method, an applicator method, or the like, in a desired thickness of, e.g., 2 to 25 μm.

Specifically, in the curing step, the photosensitive resin composition coated on a substrate may be subjected to pre-bake at a temperature of, for example, 60 to 130° C. to remove solvents; then exposed to light using a photomask having a desired pattern; and subjected to development using a developer, for example, a tetramethylammonium hydroxide (TMAH) solution, to form a pattern on the coating layer. In such event, the exposure to light may be carried out at an exposure rate of 5 to 200 mJ/cm$^2$ based on a wavelength of 365 nm in a wavelength band of 200 to 500 nm. In addition, as a light source used for the exposure (irradiation), a low-pressure mercury lamp, a high-pressure mercury lamp, an extra high-pressure mercury lamp, a metal halide lamp, an argon gas laser, or the like, may be used. X-ray, electronic ray, or the like, may also be used, if desired.

Thereafter, if necessary, the patterned coating layer is subjected to post-bake, for example, at a temperature of 150 to 300° C. for 10 minutes to 5 hours to prepare a desired cured film.

The cured film thus prepared has excellent light transmittance devoid of surface roughness when the cured film is subjected to heat treatment or is immersed in, or brought into contact with, a solvent, an acid, a base, or the like. Thus, the cured film can be used effectively as a planarization film for a TFT substrate of a liquid crystal display or an organic EL display; a partition of an organic EL display; an interlayer dielectric of a semiconductor device; a core or cladding material of an optical waveguide, and the like.

Further, the present invention provides an electronic part that comprises the cured film as a protective film.

EXAMPLE

Hereinafter, the present invention will be described in more detail with reference to the following examples. However, these examples are only provided to illustrate the present invention, and the scope of the present invention is not limited thereto.

In the following synthesis examples, the weight average molecular weight is determined by gel permeation chromatography (GPC) using a polystyrene standard.

Synthesis Example 1: Synthesis of a Siloxane Polymer (A-1)

A reactor equipped with a reflux condenser was charged with 40% by weight of phenyltrimethoxysilane, 15% by weight of methyltrimethoxysilane, 20% by weight of tetraethoxysilane, 20% by weight of pure water, and 5% by weight of propylene glycol monomethyl ether acetate (PGMEA), followed by refluxing and stirring the mixture for 7 hours in the presence of 0.1% by weight of an oxalic acid catalyst based on the total weight of the mixture and then cooling it. Thereafter, the reaction mixture was diluted with PGMEA such that the solids content was 40% by weight and subjected to a GPC analysis. As a result, the weight average molecular weight of the siloxane polymer (A-1) thus synthesized was 6,800 Da.

Synthesis Example 2: Synthesis of a First Siloxane Polymer (A-2)

A reactor equipped with a reflux condenser was charged with 20% by weight of phenyltrimethoxysilane, 30% by weight of methyltrimethoxysilane, 20% by weight of tetraethoxysilane, 15% by weight of pure water, and 15% by weight of PGMEA, followed by refluxing and stirring the mixture for 8 hours in the presence of 0.1% by weight of an oxalic acid catalyst based on the total weight of the mixture and then cooling it. Thereafter, the reaction mixture was diluted with PGMEA such that the solids content was 30% by weight and subjected to a GPC analysis. As a result, the weight average molecular weight of the first siloxane polymer (A-2) thus synthesized was about 12,000 Da.

The dissolution rate of the siloxane polymer thus synthesized in an aqueous TMAH solution was measured by the method described above. As a result, the dissolution rate of the siloxane polymer, when pre-baked, in an aqueous solution of 2.38% by weight of TMAH was 1,959.5 Å/sec.

Synthesis Example 3: Synthesis of a Second Siloxane Polymer (A-3)

A reactor equipped with a reflux condenser was charged with 20% by weight of phenyltrimethoxysilane, 30% by weight of methyltrimethoxysilane, 20% by weight of tetraethoxysilane, 15% by weight of pure water, and 15% by weight of PGMEA, followed by refluxing and stirring the mixture for 7 hours in the presence of 0.1% by weight of an oxalic acid catalyst based on the total weight of the mixture and then cooling it. Thereafter, the reaction mixture was diluted with PGMEA such that the solids content was 30% by weight and subjected to a GPC analysis. As a result, the weight average molecular weight of the second siloxane polymer (A-3) thus synthesized was about 12,000 Da.

The dissolution rate of the siloxane polymer thus synthesized in an aqueous TMAH solution was measured by the method described above. As a result, the dissolution rate of the siloxane polymer, when pre-baked, in an aqueous solution of 1.5% by weight of TMAH was 1,921.7 Å/sec.

Synthesis Example 4: Synthesis of an Epoxy Compound (D)

A three-necked flask equipped with a cooling tube was placed on a stirrer with an automatic temperature controller.

The flask was charged with 100 parts by weight of a monomer composed of glycidyl methacrylate (100% by mole), 10 parts by weight of 2,2'-azobis(2-methylbutyronitrile), and 100 parts by weight of PGMEA, followed by charging the flask with nitrogen. Thereafter, the temperature of the solution was raised to 80° C. while the solution was stirred slowly, and the temperature was maintained for 5 hours to obtain an epoxy compound having a weight average molecular weight of about 8,600 Da. Then, PGMEA was added thereto to adjust the solids content thereof to 20% by weight.

Other components were used in the following Examples and Comparative Examples, as follows.

1,2-quinonediazide compound (B-1): MIPHOTO TPA517 (an ester compound of 2-diazo-1-naphthone-5-sulfonyl chloride), Miwon Commercial Co., Ltd.

1,2-quinonediazide compound (B-2): MIPHOTO BIOC25 (an ester compound of 2-diazo-1-naphthone-5-sulfonyl chloride), Miwon Commercial Co., Ltd.

Compound (C-1) represented by the following Formula 8:

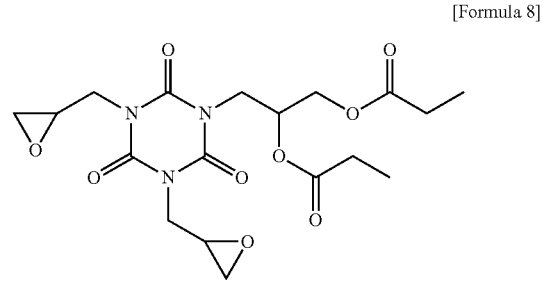

[Formula 8]

Compound (C-2) represented by the following Formula 11:

[Formula 11]

Compound (C-3) represented by the following Formula 23:

[Formula 23]

Surfactant (E): silicon-based leveling surfactant, FZ-2122, Dow Corning Toray

Silane compound (F): phenyltrimethoxysilane (PhTMOS), OFS-6124, Xiameter

Solvent (G-1): propylene glycol monomethyl ether acetate (PGMEA), Chemtronics

Solvent (G-2): γ-butyrolactone (GBL), BASF

Example 1: Synthesis of a Photosensitive Resin Composition

A mixture (or a binder) of 32.85 parts by weight of the siloxane polymer (A-1) prepared in Synthesis Example 1, 32.85 parts by weight of the first siloxane polymer (A-2) prepared in Synthesis Example 2, and 34.3 parts by weight of the second siloxane polymer (A-3) prepared in Synthesis Example 3 was obtained. Then, 100 parts by weight of the mixture was uniformly mixed with 17.8 parts by weight of the 1,2-quinonediazide-based compound (B-1), 0.7 part by weight of the 1,2-quinonediazide-based compound (B-2), 1.5 parts by weight of the compound (C-1) represented by the above Formula 8, 14.3 parts by weight of the epoxy compound (D) prepared in Synthesis Example 4, 0.35 part by weight of the surfactant (E), and 7.4 parts by weight of the silane monomer (F) on the basis of the solids content. This mixture was then dissolved in a solvent mixture of PGMEA (G-1) and GBL (G-2) at a weight ratio of 93:7 such that the solids content was 22% by weight. The solution was stirred for 1 hour and filtered through a membrane filter having 0.2 μm pores to obtain a photosensitive resin composition having a solids content of 22% by weight.

Examples 2 to 15 and Comparative Examples 1 to 5

Photosensitive resin compositions were prepared in the same manner as in Example 1, except that the siloxane polymers (A-1, A-2, and A-3), the compound (C-1) represented by the above Formula 8, the compound (C-2) represented by the above Formula 11, the compound (C-3) represented by the above Formula 23, and the epoxy compound (D) were adjusted based on the solids content as shown in Table 1 below.

TABLE 1

| | Siloxane polymer (% by weight) | | | Epoxy compound (part by weight) | Additive (part by weight) | | |
|---|---|---|---|---|---|---|---|
| | A-1 | A-2 | A-3 | D | C-1 | C-2 | C-3 |
| Ex. 1 | 32.85 | 32.85 | 34.3 | 14.3 | 1.5 | 0.0 | 0.0 |
| Ex. 2 | 32.85 | 32.85 | 34.3 | 14.3 | 1.6 | 0.0 | 0.0 |
| Ex. 3 | 32.85 | 32.85 | 34.3 | 14.3 | 4.4 | 0.0 | 0.0 |
| Ex. 4 | 32.85 | 32.85 | 34.3 | 14.3 | 7.4 | 0.0 | 0.0 |
| Ex. 5 | 32.85 | 32.85 | 34.3 | 14.3 | 10.4 | 0.0 | 0.0 |
| Ex. 6 | 32.85 | 32.85 | 34.3 | 14.3 | 14.8 | 0.0 | 0.0 |
| Ex. 7 | 32.85 | 32.85 | 34.3 | 14.3 | 15.5 | 0.0 | 0.0 |
| Ex. 8 | 32.85 | 32.85 | 34.3 | 14.3 | 16.8 | 0.0 | 0.0 |
| Ex. 9 | 32.85 | 32.85 | 34.3 | 14.3 | 0.0 | 4.4 | 0.0 |
| Ex. 10 | 32.85 | 32.85 | 34.3 | 14.3 | 0.0 | 7.4 | 0.0 |
| Ex. 11 | 32.85 | 32.85 | 34.3 | 14.3 | 0.0 | 10.4 | 0.0 |
| Ex. 12 | 32.85 | 37.15 | 30 | 0.0 | 6.5 | 0.0 | 0.0 |
| Ex. 13 | 32.86 | 67.14 | 0 | 14.3 | 7.4 | 0.0 | 0.0 |
| Ex. 14 | 32.86 | 67.14 | 0 | 14.3 | 0.0 | 7.4 | 0.0 |
| Ex. 15 | 32.85 | 67.15 | 0 | 0.0 | 6.5 | 0.0 | 0.0 |
| C. Ex. 1 | 32.85 | 32.85 | 34.3 | 14.3 | 0.0 | 0.0 | 0.0 |
| C. Ex. 2 | 32.85 | 32.85 | 34.3 | 14.3 | 0.0 | 0.0 | 7.4 |
| C. Ex. 3 | 32.85 | 37.15 | 30 | 0.0 | 0.0 | 0.0 | 0.0 |
| C. Ex. 4 | 32.85 | 67.15 | 0 | 14.3 | 0.0 | 0.0 | 0.0 |
| C. Ex. 5 | 32.85 | 67.15 | 0 | 0.0 | 0.0 | 0.0 | 0.0 |

The results of evaluation according to the following test examples are shown in Table 2 below.

Test Example 1: Evaluation of Sensitivity

The resin compositions prepared in the Examples and the Comparative Examples were each coated on to a glass substrate by spin coating. The coated substrate was then pre-baked on a hot plate kept at 105° C. for 90 seconds to form a dried film. The dried film was exposed, through a mask having a pattern of square holes and lines in sizes ranging from 1 μm to 20 μm and having the same pattern array in gray scale, to light at an exposure rate of 70 mJ/cm$^2$ based on a wavelength of 365 nm for a certain time period using an aligner (model name: MA6) that emits light having a wavelength of 200 nm to 450 nm. It was then developed with an aqueous solution developer of 2.38% by weight of TMAH through puddle nozzles at 23° C. It was then subjected to photobleaching by exposure to light at an exposure rate of 200 mJ/cm$^2$ based on a wavelength of 365 nm for a certain time period using an aligner (model name: MA6) that emits light having a wavelength of 200 nm to 450 nm. The exposed film thus obtained was heated in a convection oven at 230° C. for 30 minutes to prepare a cured film having a thickness of 2.0 μm.

For the hole pattern formed per a size of the mask of 10 μm in the above procedure, the amount of exposure energy in the exposed region required for attaining a critical dimension (CD, unit: μm) of 10 μm was measured as sensitivity (or EOP). The lower the exposure energy, the better the sensitivity of a cured film.

Test Example 2: Evaluation of Film Retention Rate

The resin compositions prepared in the Examples and the Comparative Examples were each coated on to a glass substrate by spin coating. The coated substrate was then pre-baked on a hot plate kept at 105° C. for 90 seconds to form a pre-baked film. The pre-baked film was developed with an aqueous solution developer of 2.38% by weight of TMAH through puddle nozzles at 23° C. It was then exposed to light at an exposure rate of 200 mJ/cm$^2$ based on a wavelength of 365 nm for a certain time period using an aligner (model name: MA6) that emits light having a wavelength of 200 nm to 450 nm (i.e., bleaching step). Thereafter, the exposed film thus obtained was heated in a convection oven at 230° C. for 30 minutes to prepare a cured film having a thickness of 2 μm. The film retention rate (%) was yielded from the following Equation 1 by calculating the ratio in a percent of the thickness of the film after the post-bake to that of the film after the pre-bake by using a 2- and 3-dimensional surface measuring instrument (trade name: SIS 2000, manufacturer: SNU Precision). The higher the numerical value, the better the film retention rate.

Film retention rate (%)=(film thickness after post-bake/film thickness after pre-bake)×100    [Equation 1]

Test Example 3: Evaluation of Chemical Resistance (or Swollen Thickness)

The resin compositions prepared in the Examples and the Comparative Examples were each coated on to a glass substrate by spin coating. The coated substrate was then pre-baked on a hot plate kept at 105° C. for 90 seconds to form a dried film. The dried film was developed with an aqueous solution developer of 2.38% by weight of TMAH through puddle nozzles at 23° C. for 60 seconds. It was then exposed, without a pattern mask, to light at an exposure rate of 200 mJ/cm$^2$ based on a wavelength of 365 nm for a certain time period using an aligner (model name: MA6) that emits light having a wavelength of 200 nm to 450 nm (i.e., bleaching step). Thereafter, the exposed film thus obtained was heated in a convection oven at 230° C. for 30 minutes to prepare a cured film having a thickness of 2 μm. The cured film was measured for the thickness (T1) using a non-contact type film thickness measuring instrument (SNU Precision). Then, a rework chemical (product name: TOK-106) was placed in a thermostatic chamber kept at 50° C. The cured film was immersed in the rework chemical for 2 minutes. After the rework chemical was removed with air, the film thickness (T2) was measured. The chemical resistance was calculated from the measured values by the following Equation 2 (i.e., calculation of a swollen thickness upon evaluation test of chemical resistance).

Swollen thickness (Å)=film thick (T2) upon immersion in a rework chemical−film thickness (T1) before immersion in a rework chemical        [Equation 2]

The smaller the swollen thickness, the better the chemical resistance.

Test Example 4: Evaluation of Adhesion

Figure 2:
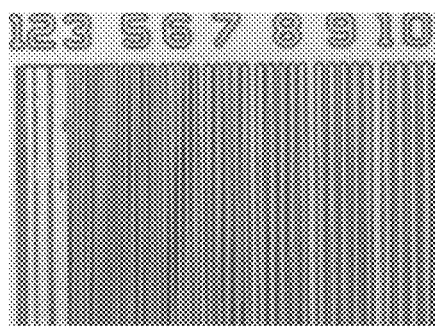
Figure 3:
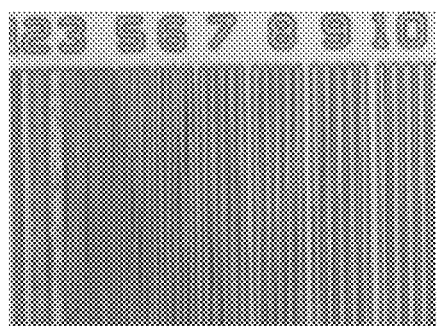
Figure 4:
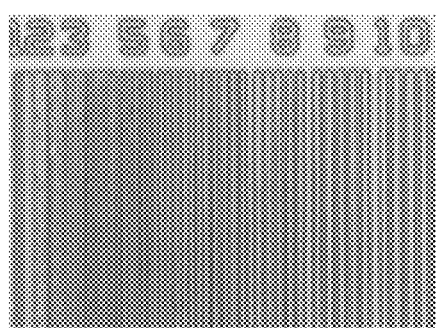
Figure 5:
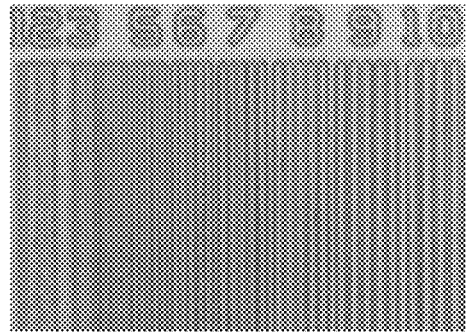
Figure 6:
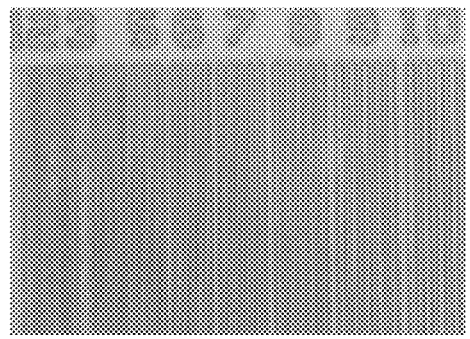
Figure 7:
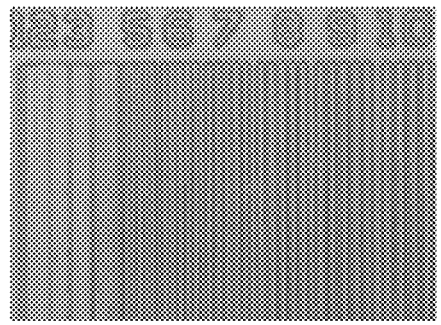
Figure 8:
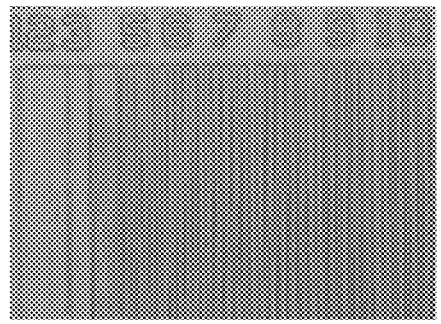
Figure 9:
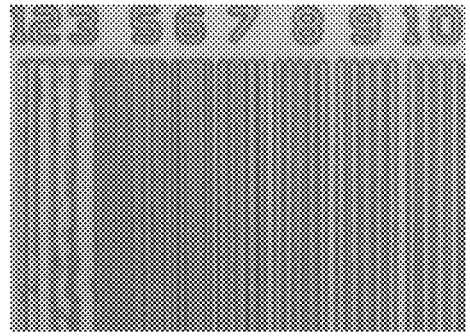
Figure 10:
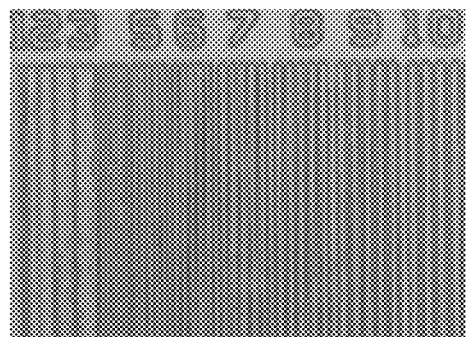
Figure 11:
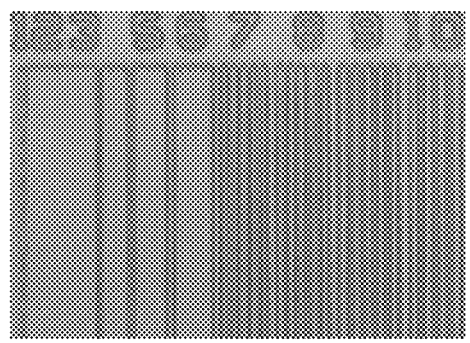
Figure 12:
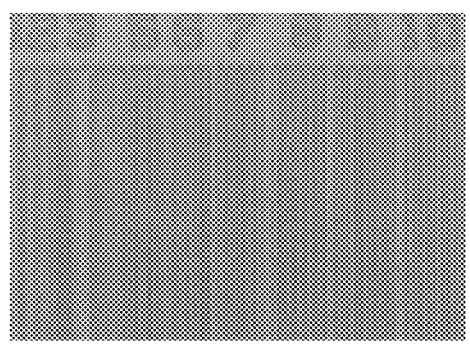
Figure 13:
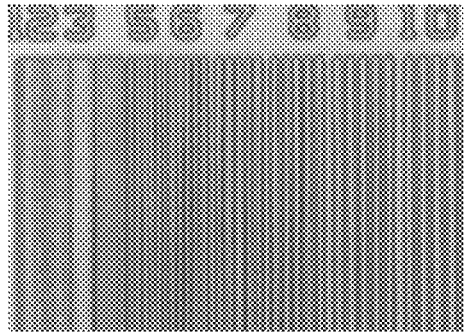
Figure 14:
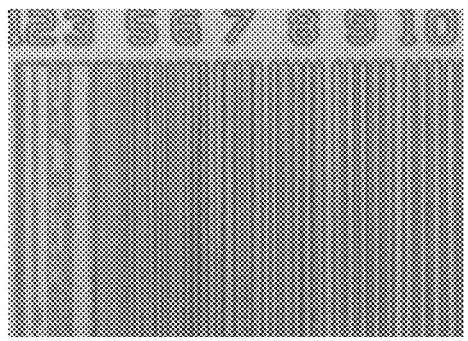
Figure 15:
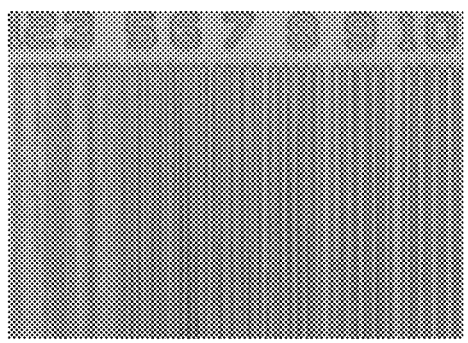
Figure 16:
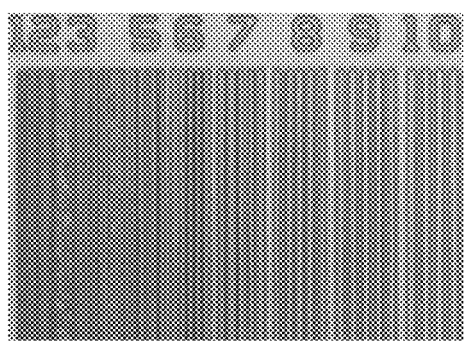
Figure 17:
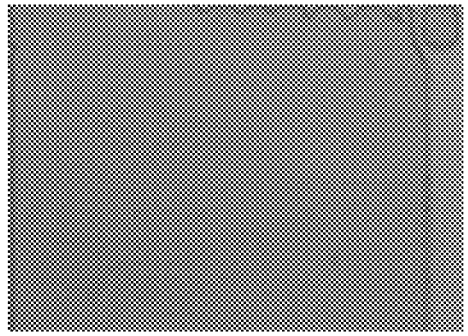
Figure 18:
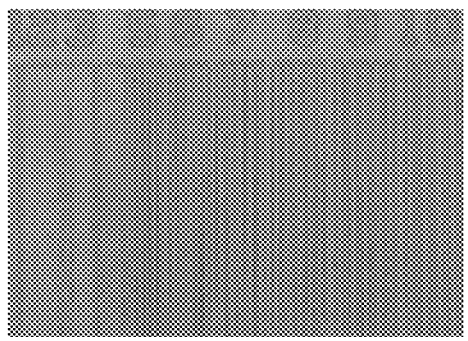
Figure 19:
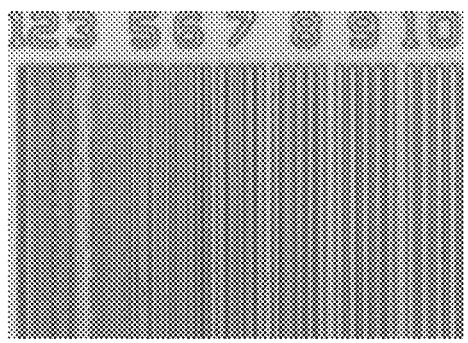
Figure 20:
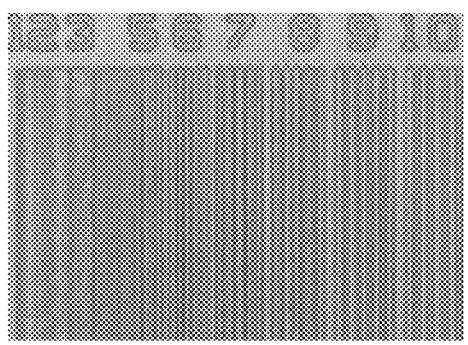

For the cured film prepared in the same manner as in Test Example 1, the line pattern having a line width of 1 to 20 μm in the EOP region was observed with an optical microscope (Olympus, STM6-LM). The minimum line width (μm) in which the line pattern was completely adhered to the substrate was taken as an evaluation criterion. The photographs taken are shown in FIGS. 1 to 20.

If the minimum line width was 10 μm or more in the above evaluation, the adhesion was not good.

Test Example 5: Evaluation of Adhesiveness Upon Immersion in a Stripper

The resin compositions prepared in the Examples and the Comparative Examples were each coated on to an ITO glass substrate by spin coating. The coated substrate was then pre-baked on a hot plate kept at 105° C. for 90 seconds to form a dried film. Thereafter, the dried film was developed with an aqueous solution developer of 2.38% by weight of TMAH through stream nozzles at 23° C. for 60 seconds. It was then exposed, without a pattern mask, to light at an exposure rate of 200 mJ/cm² based on a wavelength of 365 nm for a certain time period using an aligner (model name: MA6) that emits light having a wavelength of 200 nm to 450 nm (i.e., bleaching step). Thereafter, the exposed film thus obtained was heated in a convection oven at 230° C. for 30 minutes to prepare a cured film having a thickness of 2 μm. Then, a rework chemical (product name: TOK-106) was placed in a thermostatic chamber kept at 50° C. The cured film was immersed in the rework chemical for 2 minutes. After the rework chemical was removed with air, the cured film was subjected to a crosscut test according to ASTM D 3359.

If the test result was 4 B or higher, it was evaluated that the adhesiveness was good upon immersion in the stripper.

TABLE 2

| | Sensitivity (mJ/cm²) | Film retention rate (%) | Chemical resistance (□) (swollen thickness) | Adhesion | Adhesiveness upon immersion in a stripper |
|---|---|---|---|---|---|
| Ex. 1 | 30 | 94 | 1,623 | ○ | 5B |
| Ex. 2 | 32.5 | 94 | 1,472 | ○ | 5B |
| Ex. 3 | 27.5 | 91 | 1,074 | ○ | 5B |
| Ex. 4 | 25 | 89 | 297 | ○ | 5B |
| Ex. 5 | 20 | 82 | 100 | ○ | 5B |
| Ex. 6 | 12.5 | 62 | 339 | ○ | 5B |
| Ex. 7 | 12.5 | 59 | 387 | ○ | 5B |
| Ex. 8 | 10 | 47 | 375 | ○ | 5B |
| Ex. 9 | 21 | 89 | 1,444 | ○ | 4B |
| Ex. 10 | 21 | 86 | 526 | ○ | 5B |
| Ex. 11 | 14 | 77 | 120 | ○ | 5B |
| Ex. 12 | 10.5 | 41 | −138 | ○ | 5B |
| Ex. 13 | 31.5 | 94 | 1,111 | ○ | 5B |
| Ex. 14 | 28 | 91 | 712 | ○ | 5B |
| Ex. 15 | 17.5 | 71 | 31 | ○ | 5B |
| C. Ex. 1 | 32 | 97 | 2252 | ○ | 0B |
| C. Ex. 2 | Not measurable | 75 | Not measurable | X | Not measurable |
| C. Ex. 3 | 7 | 38 | −409 | ○ | 0B |
| C. Ex. 4 | 38.5 | 97 | 1374 | ○ | 0B |
| C. Ex. 5 | 14 | 82 | −434 | ○ | 0B |

As shown in Table 2, all of the cured films formed from the compositions of Examples 1 to 15 were excellent in sensitivity, film retention rate, chemical resistance, adhesion, and adhesiveness upon immersion in a stripper.

In contrast, the cured films formed from the compositions according to Comparative Examples 1 to 5 showed that at least one of such properties as sensitivity, film retention rate, chemical resistance, adhesion, and/or adhesiveness upon immersion in a stripper was unfavorable.

The invention claimed is:

1. A photosensitive resin composition, which comprises:
(A) a siloxane polymer;
(B) a 1,2-quinonediazide-based compound; and
(C) a compound represented by the following Formula 1:

[Formula 1]

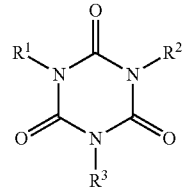

wherein $R^1$, $R^2$, and $R^3$ are each independently —$R^4$—Y—$R^5$, —$R^4$—Y—$R^6$-E, or —$R^4$-E, with the proviso that $R^1$, $R^2$, and $R^3$ are not simultaneously —$R^4$-E, and at least one of $R^1$, $R^2$, and $R^3$ is selected from —$R^4$—Y—$R^6$—E or —$R^4$-E, $R^4$ is $C_{1-6}$ alkylene, hydroxy $C_{1-6}$ alkylene, or

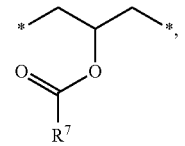

$R^5$ is $C_{1-6}$ alkyl, $C_{2-6}$ alkenyl,

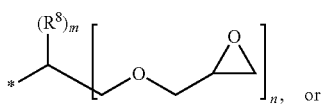, or

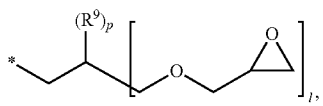

$R^6$ is $C_{1-6}$ alkylene,
$R^7$ is $C_{1-4}$ alkyl or $C_{2-4}$ alkenyl,
$R^8$ and $R^9$ are each independently hydrogen or $C_{1-3}$ alkyl,
m and n are each independently an integer of 0 to 3, with the proviso that m+n is 3,
l and p are each independently an integer of 0 to 3, with the proviso that l+p is 3,
E is an epoxy group, and
Y is

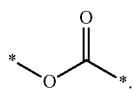

2. The photosensitive resin composition of claim 1, wherein the siloxane polymer (A) comprises a structural unit derived from a silane compound represented by the following Formula 2:

    [Formula 2]

wherein q is an integer of 0 to 3,
$R^{10}$ is each independently $C_{1-12}$ alkyl, $C_{2-10}$ alkenyl, $C_{6-15}$ aryl, 3- to 12-membered heteroalkyl, 4- to 10-membered heteroalkenyl, or 6- to 15-membered heteroaryl, and
$R^{11}$ is each independently hydrogen, $C_{1-5}$ alkyl, $C_{2-6}$ acyl, or $C_{6-15}$ aryl,
wherein the heteroalkyl, the heteroalkenyl, and the heteroaryl each independently have at least one heteroatom selected from the group consisting of O, N, and S.

3. The photosensitive resin composition of claim 2, wherein the siloxane polymer (A) comprises a structural unit derived from a compound represented by the above Formula 2 where q is 0.

4. The photosensitive resin composition of claim 1, wherein the siloxane polymer (A) is a mixture of two or more siloxane polymers that have different dissolution rates in an aqueous solution of tetramethylammonium hydroxide (TMAH), and
the siloxane polymer mixture comprises (A-1) a first siloxane polymer that, when pre-baked, has a dissolution rate of 400 to 2,000 Å/sec in an aqueous solution of 2.38% by weight of tetramethylammonium hydroxide; and (A-2) a second siloxane polymer that, when pre-baked, has a dissolution rate of 1,900 to 8,000 Å/sec in an aqueous solution of 1.5% by weight of tetramethylammonium hydroxide.

5. The photosensitive resin composition of claim 4, wherein the siloxane polymer (A) comprises 1 to 40% by weight of the second siloxane polymer (A-2) based on the total weight of the siloxane polymer.

6. The photosensitive resin composition of claim 1, wherein, in the compound represented by the above Formula 1, $R^4$ is methylene, ethylene (—$C_2H_4$—),

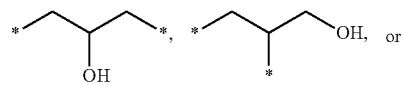

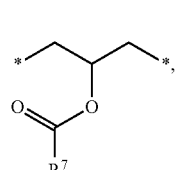

$R^5$ is methyl, ethyl, propyl, ethenyl (—$C_2H_3$), propenyl (—$C_3H_5$),

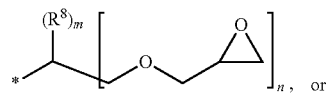, or

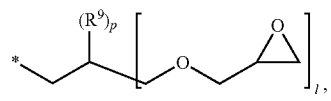

$R^6$ is $C_{1-3}$ alkylene, and
$R^7$ is ethyl or propenyl (—$C_3H_5$).

7. A photosensitive resin composition, which comprises:
(A) a siloxane polymer;
(B) a 1,2-quinonediazide-based compound; and
(C) a compound wherein the compound (C) is any one of the compounds represented by the following Formulae 3 to 14:

[Formula 3]

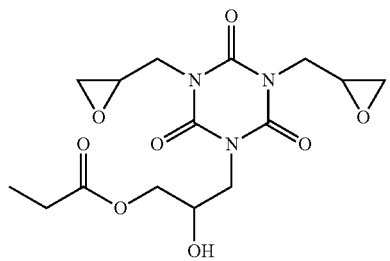

[Formula 4]
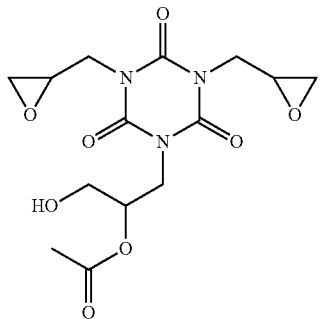
[Formula 5]
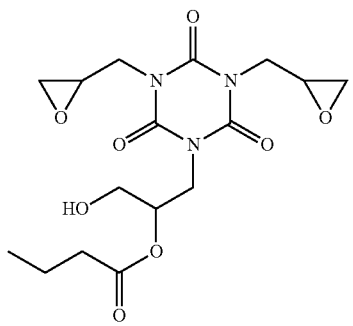
[Formula 6]
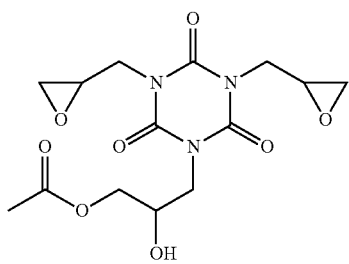
[Formula 7]
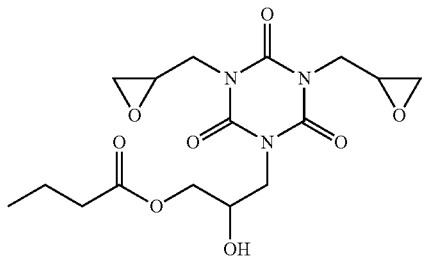
[Formula 8]
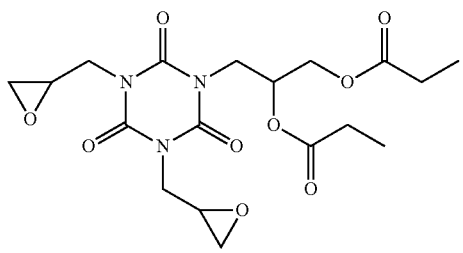

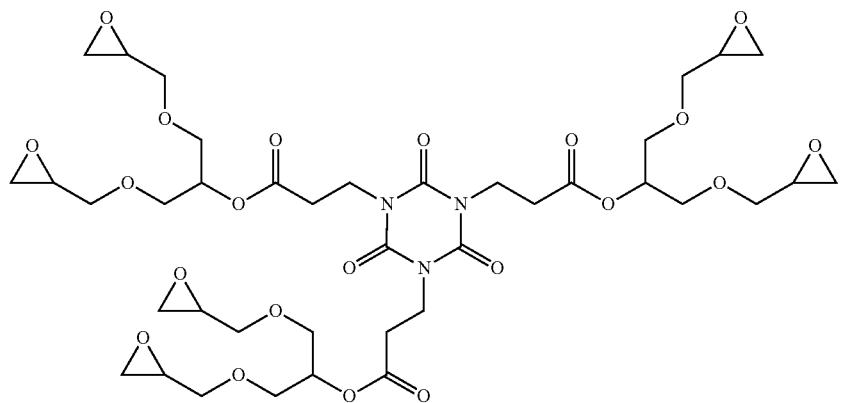
[Formula 9]
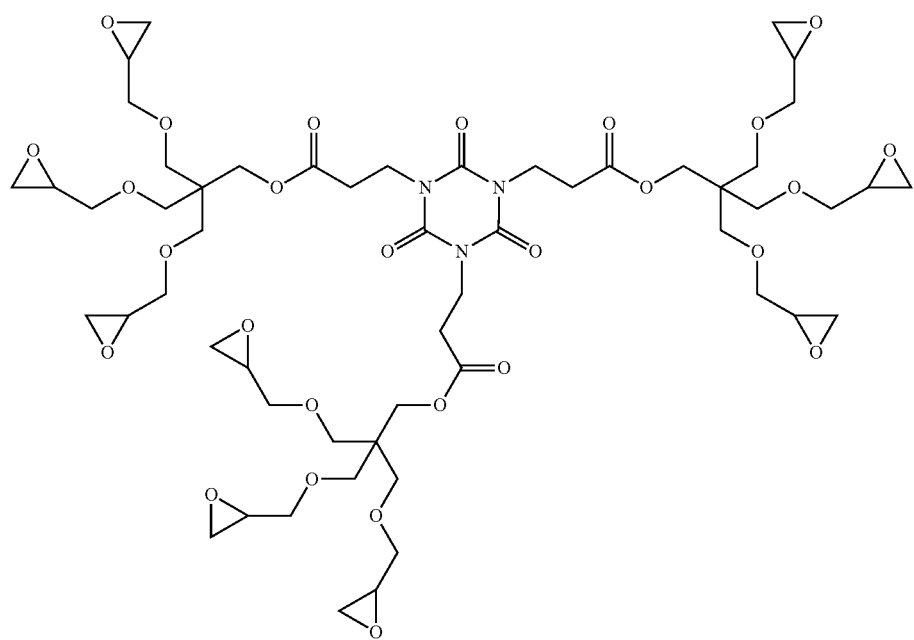
[Formula 10]
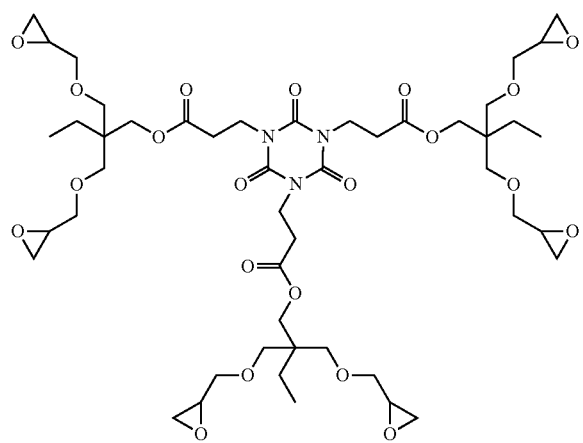
[Formula 11]

-continued

[Formula 12]

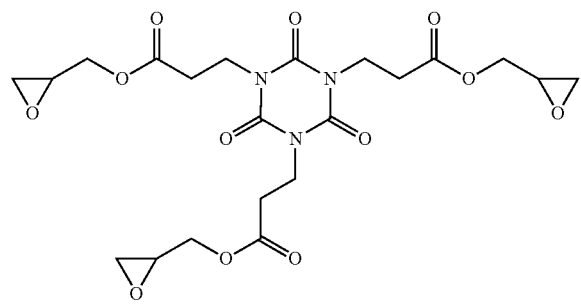

[Formula 13]

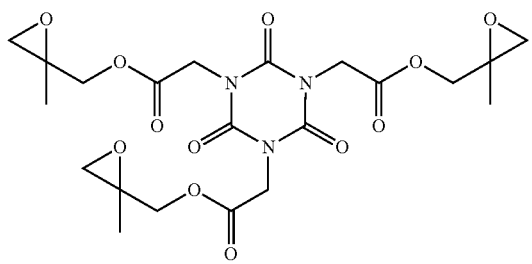

[Formula 14]

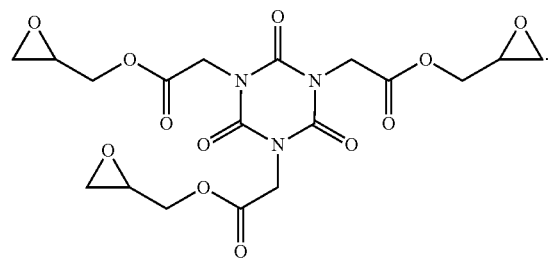

8. The photosensitive resin composition of claim 1, wherein the compound (C) represented by the above Formula 1 is employed in an amount ranging from 1.6 to 16 parts by weight based on 100 parts by weight of the siloxane polymer (A) on the basis of the solids content.

9. The photosensitive resin composition of claim 1, which further comprises at least one selected from the group consisting of (D) an epoxy compound, (E) a surfactant, and (F) a silane compound.

* * * * *